INVENTOR.
RONALD J. DEAN
BY
Frank R. Trifari
AGENT

*INVENTOR.*
RONALD J. DEAN
*BY*
Frank R. Trifari
AGENT

United States Patent Office 3,435,514

Patented Apr. 1, 1969

3,435,514
METHODS OF MANUFACTURING SEMICONDUCTOR DEVICES

Ronald John Dean, Southampton, England, assignor to North American Philips Company, Inc., New York, N.Y.

Filed Sept. 12, 1966, Ser. No. 578,631
Claims priority, application Great Britain, Sept. 13, 1965, 38,976/65
Int. Cl. B01j *17/00;* H01l *1/14, 7/02*
U.S. Cl. 29—577 11 Claims

ABSTRACT OF THE DISCLOSURE

A method for connecting plural contacts on a semiconductor body to external terminals or other contacts using a metal sheet. The sheet is selectively oxidized to leave a desired pattern of conductive regions maintained by the oxidized sheet parts, and then the sheet is aligned with the body contacts and secured thereto. Especially useful for connecting integrated circuit chips to the terminal pins of a package therefor.

The invention relates to semiconductor devices.

In the manufacture of semiconductor devices it is known to connect to contacts provided on a semiconductor body using wire. The wire may be secured by soldering or pressure welding. As an alternative conductors may be provided by vacuum deposited metal conductors, in which case wire conductors are usually secured to the vacuum deposited conductors. Making large numbers of connections is costly in operator time and for small contacts or conductors the time required for making individual connections to each of them is considerable.

It has been suggested to deposit a conductive pattern onto a glass or ceramic support, to arrange the support with the pattern in the desired position relative to the contacts provided on the semiconductor body and to secure the pattern and contacts together, for example if the support is transparent, with the aid of a laser.

It has also been suggested in British patent specification No. 873,043 to secure a metal lamina mechanically and electrically to electrodes provided on a semiconductor body and to remove portions of the lamina so that separate connections to the electrodes are left. This method of securing is stated to be particularly suitable for the manufacture of high-power transistors and in the embodiments described the lamina is shown as having sufficient stiffness to be bent round curved bends to determine the spacing between a base plate and the semiconductor body.

Copending British patent specification No. 6193/65 describes and claims a method of manufacturing a semiconductor device comprising a semiconductor body, in which a metal foil is treated to produce a pattern of at least substantially separated metal connections held in predetermined relative positions and the metal foil so treated is held in position relative to contacts provided on the body while metal contact areas of the pattern are secured to contacts on the body.

The present invention provides an alternative method of manufacturing a semiconductor device.

According to the invention, in a method of manufacturing a semiconductor device comprising a semiconductor body, a metal sheet is oxidised in part to produce a pattern of metal connections held in predetermined relative positions by the insulating metal oxide and the sheet so treated is held in position relative to contacts provided on the body while metal contact areas of the pattern are secured to contacts on the body.

The oxidation to produce the pattern may be effected from both sides of the sheet. This may involve the application of a similar pattern of protecting resist to both sides of the sheet. The advantage in this case is obtained that the pattern definition, there may be sideways spread of oxidation beneath the resist, is improved. As an alternative, the entire surface of one side of the sheet may be oxidised so that the conductive pattern is insulated at one side. Further, the surfaces of the metal connections may be provided with an insulating layer except at and adjacent the contact areas and this insulating layer may be provided by oxidation.

If desired, parts of the metal sheet in addition to the pattern may remain unoxidised, these parts being removed or severed through after the metal contact areas of the pattern are secured to contacts on the body. Thus the outer periphery of the sheet may be left in metal form and later removed.

The metal sheet may be of aluminium, in which case the aluminium oxide regions are sufficiently transparent to permit positioning of the sheet on the body by visual inspection.

The use of a flexible sheet is advantageous if connection is to be made to a larger number of contacts on a body or to contacts on a plurality of bodies and the thickness of such a flexible metal sheet may be 60$\mu$ or less. Contact areas of the treated sheet may first be secured to a first semiconductor body and thereafter other contact areas may be secured to contacts on a second semiconductor body. The body or bodies may be secured to a header either before or after the treated sheet is secured to the body or bodies. The header may comprise contact pins, in which case connection may be made between contact areas of the pattern and the contact pins after the body is, or the bodies are, secured to the header.

The invention also relates to a semiconductor device when manufactured by the method according to the invention.

Embodiments of the method according to the invention will now be described, by way of example, with reference to the accompanying diagrammatic drawings, in which.

Figure 1:
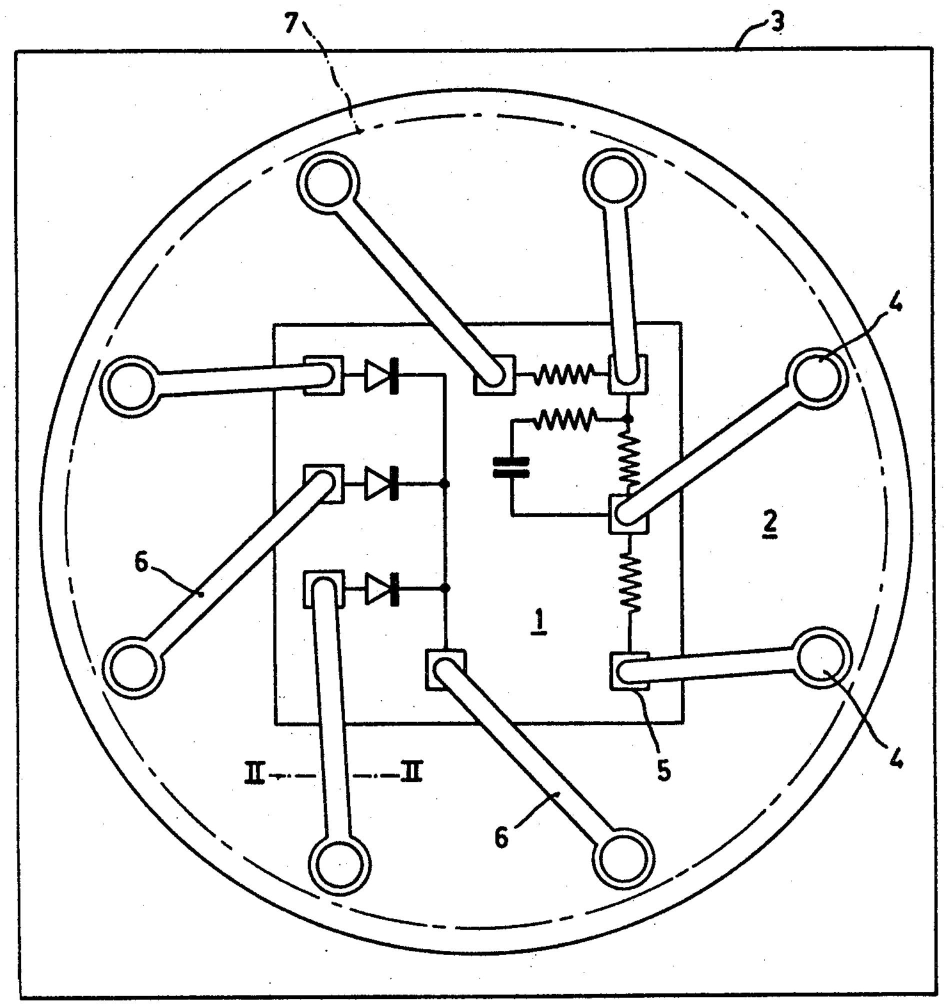
FIGURE 1 is a plan view of part of a semiconductor device manufactured by a method according to the invention.

Referring now to FIGURE 1, a semiconductor body 1 is shown mounted on a header 2. A pattern of aluminium connections 6 is provided on a sheet 3 part of which is oxidised to form insulating aluminium oxide. The connections 6 are secured to contact pins 4 of the header 2 and contacts 5 provided on the body 1.

The position of the contacts 5 on the body 1 and the components provided on or in the body are not important in relation to the invention. The components shown are three rectifiers having separate inputs and a common output and a resistor-capacitor network such as may together be used in a gating circuit.

The sheet 3 extends beyond the header 2 for ease of handling during manufacture and each connection 6 of the pattern is so fashioned as to pass over one of the pins 4 and terminate at one of the contacts 5.

The patterned sheet is made from an aluminium sheet by providing a protecting resist of a similar pattern on both sides of the sheet so that oxidation may be effected over corresponding areas from each side. Many suitable commercial resists are available. As an example, the positive resist available commercially under the trade name of "Kopierlac-P" may be used. The resist pattern may be provided by a photolithographic method. The sheet with the resist layer is slightly etched in a solution of dilute caustic soda and is then immersed in an electrolytic oxidising bath which may have the following composition—a solution of sulphuric acid in distilled water having a specific gravity of 1.145 at 18° C. and 2% by volume of glycerine.

The addition of glycerine appears to produce a more flexible oxide. Electrolytic oxidising is effected with the use of a 12 volt supply and a current of 10 amps./sq. ft. for 35 minutes at room temperature in order to oxidise the aluminium, where not protected by the resist to a depth of 30$\mu$.

The patterned sheet is then washed and dried, placed on the body 1, and may be aligned since aluminium oxide is sufficiently transparent, with the aid of a binocular microscope, and at least two of the connections 6 secured to the appropriate contacts 5 by any known method. One method which may be used is ultrasonic pressure welding in which a conductor 6 and a contact 5 are held together under a light pressure and ultrasonic energy is applied to make the bond. As an alternative, the bond may be made with the aid of a laser. The use of a laser in the manufacture of semiconductor devices is described inter alia in copending British patent specification No. 50545/64 and Industrial Electronics, October 1964, pages 478 and 479. After two bonds have been made the relative positions of the body 1 and the sheet 3 are determined and the other bonds may thereafter be made. If desired, a multiple-head bonding machine may be used and, after alignment, all the bonds may be made at one time. For smaller bodies, it may not be possible to use a multiple-head bonding machine.

The patterned sheet 3 with the body 1 attached thereto by the bonds may now be manipulated as a single body, the sheet being strong enough to support the body. The sheet is aligned, relative to the pins 4 of a header 2 with a gold foil (not shown) between the header 2, which may be of a gold-plated metal, for example Fernico or Kovar, and the underside of the body 1. The aligned sheet is then bonded to the top surfaces of the pins 4. The pins 4 may readily be made larger than the contacts 5 and this bonding may be effected by spot welding. Again, the sheet is held in the aligned position after two of the bonds have been made and again the bonding may be effected for all of the pins 4 simultaneously, if desired, with the aid of a multi-head spot welder.

The whole is heated to 410° C. to secure the body 1 in an electrically-conductive manner to the header 2.

The outer part of the sheet is removed, for example by cutting along the chain-dot line 7.

Finally, the header may be secured to a can (not shown) to enclose a dry nitrogen or other suitable ambient.

It is mentioned that, as an alternative, the body 1 may first be secured to the header 2 and the patterned sheet 3 thereafter secured to the body 1 and the pins 4. The contact areas of the patterned sheet 3 for securing to the pins 4 may be made large enough to provide a reasonable latitude in the positioning of the body. Further the patterned sheet 3 may provide interconnections between two or more bodies which may be mounted on a single header.

In a particular case with a single body 1 and eight pins 4 as shown in FIGURE 1, the patterned aluminium sheet was a square 50$\mu$ thick and 15 mm. x 15 mm., the connections 6 produced were 75$\mu$ across, about 3.5 mm. long and the circular ends for securing to the pins 4 were 2 mm. in diameter. The body 1 was 1.5 mm. x 1.5 mm. in the plane of FIGURE 1 and the contacts 5 were circular and about 150$\mu$ in diameter. The pins were 0.4 mm. in diameter. Successful operation of the method described above has been obtained with contacts 5 of 50$\mu$ diameter and with a spacing between adjacent contacts of 300$\mu$.

The interconnections between components in the example shown in FIGURE 1 are provided in or on the body 1. However, interconnection may be provided by the sheet 3. In some cases interconnection may be provided by a connection of the pattern extending between two connections provided for securing to two of the pins 4 or a separate interconnecting part of the pattern may be provided by the sheet.

Figure 2:
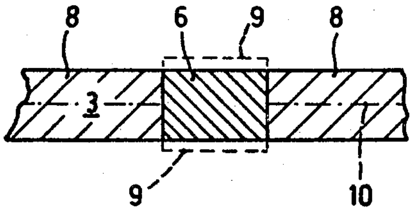
FIGURE 2 is a cross-sectional view of a sheet used in the manufacture of the device shown in FIGURE 1, taken along the line II—II of FIGURE 1, and FIGURES 3, 4 and 5 are cross-sectional views corresponding to that of FIGURE 2 and each illustrating a modification of the method described with reference to FIGURES 1 and 2.

FIGURE 2 shows a connection 6 in the sheet 3 the part 8 of which has been oxidised in the manner described above with reference to FIGURE 1. The position of the resist is shown in broken lines 9 and the minimum depth of the oxide, oxidation being effected from both sides of the sheet 3, is shown by the chain-dot line 10.

Figure 3:
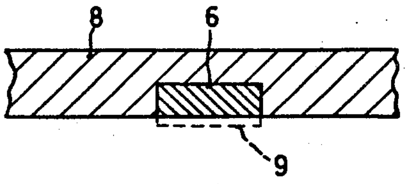

FIGURE 3 shows a modification in which the resist shown in broken lines 9 is applied only to one surface of the sheet, the whole of the other surface being unprotected. This results in a connection 6 having insulating oxide on three sides.

Figure 4:
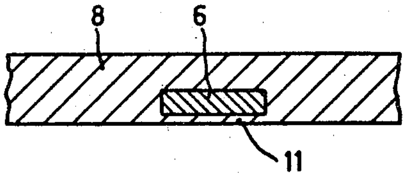

FIGURE 4 shows a further modification in which not only does the connection 6 have insulating oxide 8 on three sides but also has insulating oxide 11 on the fourth side except at contact areas where contact with a pin 4 or a contact 5 is to be made. As an alternative, the insulating effect of the oxide 11 may be obtained by providing a superficial insulating coating on the otherwise exposed surface of a connection 6. The oxide 11, or the alternative superficial insulating coating, reduces the possibility that the connections 6 provide unwanted contact with parts of the body 1 or with contacts provided thereon. These expedients are not essential with the comparatively simple example illustrated in FIGURE 1 but may be advantageous for more complex cases.

Figure 5:
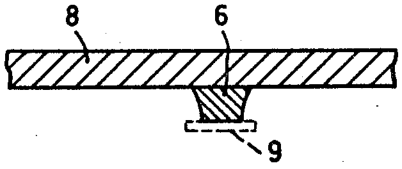

FIGURE 5 shows another modification in which the entire sheet is oxidised from one side to provide an oxide layer 8 and at the other side a resist pattern is provided, a part of which is shown in broken lines 9. The part of the remaining sheet not protected by the resist is then etched away using an etchant which does not affect the oxide 8, leaving the pattern, one connection 6 of which is shown.

It is mentioned that the reasonable limiting depth of oxidation of aluminium is about 30$\mu$. Using the etching technique of FIGURE 5, the thickness of the connections, such as that shown at 6, may be greater the permissible thickness being determined by the etching process used and the degree of undercutting in the etching which is permissible in any particular case.

A suitable etchant for removing aluminium is a distilled water solution of hydrochloric acid containing 50% by volume of concentrated hydrochloric acid and ½% by volume of a wetting agent.

In the example described with reference to FIGURE 1, the sheet 3 is oxidised with the exception of the connections 6. This is not essential and other parts of the sheet may be left unoxidised, for example a peripheral part of the sheet which may lie outside the line 7 or parts intermediate the connections 6. Unwanted conducting parts of the sheet may be removed or severed through before the manufacture of the device is completed.

Although in the description above connection is made to pins 4, connection may alternatively be made to other contacts, for example, to contacts deposited on a support.

What I claim is:

1. A method of manufacturing a semiconductor device comprising a semiconductor body having contacts, comprising oxidizing in part a metal sheet to produce a pattern of metal connections held in predetermined relative positions by the insulating metal oxide, and holding the sheet so treated in position relative to contacts on the body while metal contact areas of the pattern are secured to the said contacts on the body.

2. A method as claimed in claim 1 wherein the oxidation to produce the pattern is effected from both sides of the sheet.

3. A method as claimed in claim 2 wherein the entire surface of one side of the sheet is oxidized.

4. A method as claimed in claim 1 wherein surfaces of the metal connections are provided with an insulating layer except at and adjacent the contact areas.

5. A method as claimed in claim 4 wherein the insulating layer at the surfaces of the metal connections is produced by oxidation.

6. A method as claimed in claim 1 wherein parts of the metal sheet in addition to the pattern remain unoxidised and these parts are removed or severed through after the metal contact areas of the pattern are secured to the contacts on the body.

7. A method as claimed in claim 1 wherein the metal sheet is of aluminium.

8. A method as claimed in claim 1 wherein the thickness of the metal sheet is 60$\mu$ or less.

9. A method as claimed in claim 8 wherein after the treated sheet is secured to a first semiconductor body, contact areas of the pattern are similarly secured to contacts on a second semiconductor body.

10. A method as claimed in claim 8 wherein after the treated sheet is secured to the body, the body is secured to a header.

11. A method as claimed in claim 10 wherein the header comprises contact pins and connection is made between contact areas of the pattern and the contact pins after the body is secured to the header.

References Cited

UNITED STATES PATENTS

| | | | |
|---|---|---|---|
| 2,744,308 | 5/1956 | Loman | 29—591 |
| 3,169,892 | 2/1965 | Lemelson | 29—626 X |
| 3,317,287 | 5/1967 | Caracciolo. | |

WILLIAM I. BROOKS, *Primary Examiner.*

U.S. Cl. X.R.

29—589, 590, 626